United States Patent
Bains et al.

(10) Patent No.: US 10,489,083 B2
(45) Date of Patent: Nov. 26, 2019

(54) FLEXIBLE COMMAND ADDRESSING FOR MEMORY

(71) Applicant: Intel Corporation, Santa Clara, CA (US)

(72) Inventors: Kuljit S. Bains, Olympia, WA (US); John B. Halbert, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 266 days.

(21) Appl. No.: 15/487,332

(22) Filed: Apr. 13, 2017

(65) Prior Publication Data

US 2017/0300270 A1 Oct. 19, 2017

Related U.S. Application Data

(63) Continuation of application No. 14/926,860, filed on Oct. 29, 2015, now abandoned, which is a (Continued)

(51) Int. Cl.
*G06F 3/06* (2006.01)
*G11C 7/10* (2006.01)
(Continued)

(52) U.S. Cl.
CPC .......... *G06F 3/0659* (2013.01); *G06F 3/0605* (2013.01); *G06F 3/0683* (2013.01); *G06F 13/4022* (2013.01); *G06F 13/4282* (2013.01); *G06F 13/4295* (2013.01); *G06F 15/7807* (2013.01); *G11C 7/1003* (2013.01); *G11C 7/1072* (2013.01); *G11C 8/12* (2013.01); *G11C 11/4076* (2013.01); *G11C 11/4087* (2013.01);
(Continued)

(58) Field of Classification Search
CPC .... G06F 12/00; G06F 3/0659; G06F 15/7807; G06F 3/0605; G06F 3/0683; G06F 13/4022
USPC .......................................... 711/100, 105, 154
See application file for complete search history.

(56) References Cited

U.S. PATENT DOCUMENTS

| | | | |
|---|---|---|---|
| 5,600,605 A * | 2/1997 | Schaefer | G11C 7/12 365/230.03 |
| 5,715,407 A | 2/1998 | Barth et al. | |

(Continued)

FOREIGN PATENT DOCUMENTS

| | | |
|---|---|---|
| KR | 100866958 B1 | 11/2008 |
| TW | 201015338 | 4/2010 |

OTHER PUBLICATIONS

JEDEC Standard No. 21-C, Release 9r12, General SDRAM Functions, www.jedec.com, 20 pages.
(Continued)

*Primary Examiner* — Tuan V Thai
(74) *Attorney, Agent, or Firm* — Compass IP Law, PC

(57) ABSTRACT

Flexible command addressing for memory. An embodiment of a memory device includes a dynamic random-access memory (DRAM); and a system element coupled with the DRAM, the system element including a memory controller for control of the DRAM. The DRAM includes a memory bank, a bus, the bus including a plurality of pins for the receipt of commands, and a logic, wherein the logic provides for shared operation of the bus for a first type of command and a second type of command received on a first set of pins.

20 Claims, 10 Drawing Sheets

Related U.S. Application Data continuation of application No. 13/536,663, filed on Jun. 28, 2012, now Pat. No. 9,202,551.

(51) Int. Cl.

| | |
|---|---|
| *G11C 8/12* | (2006.01) |
| *G11C 11/4076* | (2006.01) |
| *G11C 11/408* | (2006.01) |
| *G11C 11/4097* | (2006.01) |
| *G06F 13/42* | (2006.01) |
| *G06F 13/40* | (2006.01) |
| *G06F 15/78* | (2006.01) |

(52) U.S. Cl.
CPC ........ *G11C 11/4097* (2013.01); *G11C 7/1021* (2013.01); *Y02D 10/14* (2018.01); *Y02D 10/151* (2018.01)

(56) References Cited

U.S. PATENT DOCUMENTS

| | | | |
|---|---|---|---|
| 6,154,821 A * | 11/2000 | Barth | G06F 1/3225 711/170 |
| 2003/0028744 A1* | 2/2003 | Fackenthal | G06F 13/4243 711/200 |
| 2006/0184726 A1 | 8/2006 | Klint et al. | |
| 2007/0030201 A1 | 2/2007 | Tung | |
| 2007/0223264 A1 | 9/2007 | Bains et al. | |
| 2008/0291727 A1 | 11/2008 | Seo et al. | |
| 2009/0296514 A1 | 12/2009 | Yeh | |
| 2010/0005214 A1 | 1/2010 | Trombley et al. | |
| 2010/0072602 A1 | 3/2010 | Sutardja | |
| 2010/0110745 A1 | 5/2010 | Jeddeloh et al. | |
| 2010/0318765 A1 | 12/2010 | Kirsch | |
| 2011/0161713 A1 | 6/2011 | Methar et al. | |
| 2013/0254473 A1* | 9/2013 | Bartley | G11O 5/02 711/105 |

OTHER PUBLICATIONS

German Examination Report for Patent Application No. 112013003219.8 , dated Jan. 10, 2018, 6 pages.

Advisory Action dated Apr. 30, 2015, in U.S. Appl. No. 13/536,663, 5 pages.

Advisory Action dated Aug. 6, 2014, in U.S. Appl. No. 13/536,663, 11 pages.

International Preliminary Report for PCT Application No. PCT/US2013/044360 dated Dec. 31, 2014, 7 pages.

International Search Report and Written Opinion of the International Searching Authority dated Sep. 13, 2013, in International Patent Application No. PCT/US2013/044360, 10 pages.

JEDEC Standard, Wide I/O Single Data Rate (Wide I/O SDR), JESD229, JEDEC Solic State Technology Association, Dec. 2011, 211 pages.

Notice of Allowance in Taiwanese Application No. 102120902 dated Apr. 27, 2015, 2 pages.

Notice of Allowance dated Jul. 31, 2015, in U.S. Appl. No. 13/536,663, 19 pages.

Office Action dated Dec. 11, 2014 (+ English translation), in Taiwan Patent Application No. 102120902, 23 pages.

Office Action dated Feb. 20, 2015, in U.S. Appl. No. 13/536,663, 23 pages.

Office Action dated Jan. 30, 2014, in U.S. Appl. No. 13/536,663, 20 pages.

Office Action dated May 27, 2014, in U.S. Appl. No. 13/536,663, 21 pages.

Office Action dated Oct. 6, 2014, in U.S. Appl. No. 13/536,663, 22 pages.

Richard Swinburne, "DDR4: What we can Expect," Bit-tech (http://www.bit-tech.net/hardware/memory/2010/08/26/ddr4-what-we-can-expecU1), Aug. 26, 2010, 2 pages.

First Office Action for U.S. Appl. No. 14/926,860, dated Oct. 14, 2016, 22 pages.

JEDEC Standard, "DDR3 SDRAM"JESD79-3C (Revision of Jesd79-3B, Apr. 2008), JEDEC Solid State Technology Association, Nov. 2008, 211 pages.

JEDEC Standard, "Wide I/O Single Data Rate (Wide I/O SDR)", JESD229, JEDEC Solid State Technology Association, Dec. 2011, 74 pages.

\* cited by examiner

| | Channel Density | | | | | |
|---|---|---|---|---|---|---|
| | 1Gb | 2Gb | 4Gb | 8Gb | 16Gb | 32Gb |
| Channel Width | 128 | 128 | 128 | 128 | 128 | 128 |
| Prefetch Size (bits) | 256 | 256 | 256 | 256 | 256 | 256 |
| Row Address | RA[12:0] | RA[13:0] | RA[13:0] | RA[13:0] | RA[14:0] | RA[15:0] |
| Column Address | CA[5:0] | CA[5:0] | CA[5:0] | CA[6:0] | CA[6:0] | CA[6:0] |
| Bank Address | BA[2:0] | BA[2:0] | BA[3:0] | BA[3:0] | BA[3:0] | BA[3:0] |
| Autoprecharge | CA7 | CA7 | CA7 | CA7 | CA7 | CA7 |
| Page Size | 2KB | 2KB | 2KB | 4KB | 4KB | 4KB |

| Row Commands | | SDR Command Pins | | | DDR Command/Address Pins | | | | | | |
|---|---|---|---|---|---|---|---|---|---|---|---|
| Function | Symbol | CKE | | Clock Cycle | DDR CA Row Pins (6) | | | | | | Notes |
| | | CK_t(n-1) | CK_t(n) | | R(0) | R(1) | R(2) | R(3) | R(4) | R(5) | |
| Row No-Operation | RNOP | H | H | Rising | H | H | H | V | V | V | |
| | | H | H | Falling | V | V | PAR | V | V | V | 1,4,7 |
| | ACT | H | H | Rising | L | H | R15 | BA0 | BA1 | BA2 | |
| | | H | H | Falling | R11 | R12 | PAR | R13 | R14 | BA3 | |
| | | H | H | Rising | R5 | R6 | R7 | R8 | R9 | R10 | 1,2,3,4,7 |
| Activate | | H | H | Falling | R0 | R1 | PAR | R2 | R3 | R4 | |
| Precharge | PRE | H | H | Rising | H | H | L | BA0 | BA1 | BA2 | |
| | | H | H | Falling | V | V | PAR | V | L | BA3 | 1,3,4,7 |
| Precharge All | PREA | H | H | Rising | H | H | L | BA0 | BA1 | BA2 | |
| | | H | H | Falling | V | V | PAR | V | H | BA3 | 1,3,4,7 |
| Refresh (per Bank) | REFA | H | H | Rising | L | L | H | BA0 | BA1 | BA2 | |
| | | H | H | Falling | V | V | PAR | V | L | BA3 | 1,3,4,7 |
| Refresh | REFA | H | H | Rising | L | L | H | BA0 | BA1 | BA2 | |
| | | H | H | Falling | V | V | PAR | V | H | BA3 | 1,4,7 |
| Pwr Dwn Entry | PDE | H | L | Rising | H | H | H | V | V | V | |
| | | | | Falling | V | V | PAR | V | V | V | 1,4,6,7 |
| Self Refresh Entry | SRE | H | L | Rising | L | L | H | V | V | V | |
| | | | | Falling | V | V | PAR | V | V | V | 1,4,6,7 |
| Pwr Dwn & Self Refresh | PDX/SRX | L | H | Rising | H | H | H | X | X | X | |
| | | | | Falling | X | X | X | X | X | X | 1,5,6,7 |

Notes:
1. BA= Bank Address; PAR=Parity Signal; V=Valid Signal (either H or L).
2. The unused upper row address bits RA13, RA14 and RA15 to Valid signal level depending on the DRAM density; they are evaluated in the parity calculation if the parity function is enabled in the mode register.
3. For 8 bank device, BA3 must be driven to Valid signal level; it is evaluated in the parity calculation if the parity function is enabled in the mode register.
4. PAR signal must be driven to Valid signal level even if Parity function is disabled in DRAM mode register.
5. No Parity checking at Power Down Exit or Self Refresh Exit command. The HBM device requires RNOP and CNOP commands on Row and Column bus respectively with valid parity if enabled during power down exit period (tXP) and self refresh exit period (tXS).
6. CKE is a single data rate input and CKE transition from High to Low or Low to High is evaluated only with the rising clock edge. Refer to CKE Truth Table for more detail with CKE transitions.
7. All other command encoding not shown in the table for pins R[4,2:0] at the rising clock edge are reserved commands for future use.

| Col Commands Function | Symbol | SDR Command Pins CKE | | Clock Cycle | DDR Command/Address Pins DDR CA Column Pins (8) | | | | | | | | Notes |
|---|---|---|---|---|---|---|---|---|---|---|---|---|---|
| | | CK_t(n-1) | CK_t(n) | | C0 | C1 | C2 | C3 | C4 | C5 | C6 | C7 | |
| Column No-Operation | CNOP | H | H | Rising | H | H | H | V | V | V | V | V | |
| | | H | H | Falling | V | V | PAR | V | V | V | V | V | 1,4,5,6 |
| Read | RD | H | H | Rising | H | L | H | L | BA0 | BA1 | BA2 | BA3 | 1,2,3,4, |
| | | H | H | Falling | C0 | C1 | PAR | C2 | C3 | C4 | C5 | C6 | 5,6 |
| Read w/AP | RDA | H | H | Rising | H | L | H | H | BA0 | BA1 | BA2 | BA3 | 1,2,3,4, |
| | | H | H | Falling | C0 | C1 | PAR | C2 | C3 | C4 | C5 | C6 | 5,6 |
| Write | WR | H | H | Rising | H | L | L | L | BA0 | BA1 | BA2 | BA3 | 1,2,3,4, |
| | | H | H | Falling | C0 | C1 | PAR | C2 | C3 | C4 | C5 | C6 | 5,6 |
| Write | WRA | H | H | Rising | H | L | L | H | BA0 | BA1 | BA2 | BA3 | 1,2,3,4, |
| | | H | H | Falling | C0 | C1 | PAR | C2 | C3 | C4 | C5 | C6 | 5,6 |
| Mode Register Set | MRR | H | H | Rising | L | L | L | OP7 | MA0 | MA1 | MA2 | MA3 | |
| | | H | H | Falling | OP0 | OP1 | PAR | OP2 | OP3 | OP4 | OP5 | OP6 | 1,2,4,5,6 |

Notes:
1. BA= Bank Address; PAR=Parity Signal; V=Valid Signal (either H or L).
2. The unused upper column address bit CA6 must be driven to Valid signal level depending on the DRAM density; it is evaluated in the parity calculation if the parity function is enabled in the mode register.
3. For 8 bank device, BA3 must be driven to Valid signal level; it is evaluated in the parity calculation if the parity function is enabled in the mode register.
4. PAR signal must be driven to Valid signal level if Parity function is disabled in DRAM mode register.
5. CKE transition from High to Low or Low to High must be accompanied with a Column No Operation (CNOP) command. Refer to CKE Truth Table for more detail with CKE transition.
6. All other command encoding not shown in the table for pins C[3:0] at the rising clock edge are reserved commands for future use.

FIG. 5

600
Col Commands

| Function | Symbol | SDR Command Pins CKE | | Clock Cycle | DDR Command/Address Pins DDR Row Column combined Pins (8) | | | | | | | |
|---|---|---|---|---|---|---|---|---|---|---|---|---|
| | | CK_t(n-1) | CK_t(n) | | RC0 | RC1 | RC2 | RC3 | RC4 | RC5 | RC6 | RC7 |
| Column No-Operation (Row/Column) | Common NOP | H | H | Rising | H | H | H | V | V | V | V | V |
| | | H | H | Falling | V | V | PAR | V | V | V | V | V |
| Read | RD | H | H | Rising | H | L | H | L | BA0 | BA1 | BA2 | BA3 |
| | | H | H | Falling | C0 | C1 | PAR | C2 | C3 | C4 | C5 | C6 |
| Read w/ AP | RDA | H | H | Rising | H | L | H | H | BA0 | BA1 | BA2 | BA3 |
| | | H | H | Falling | C0 | C1 | PAR | C2 | C3 | C4 | C5 | C6 |
| Write | WR | H | H | Rising | H | L | L | L | BA0 | BA1 | BA2 | BA3 |
| | | H | H | Falling | C0 | C1 | PAR | C2 | C3 | C4 | C5 | C6 |
| Write | WRA | H | H | Rising | H | L | L | H | BA0 | BA1 | BA2 | BA3 |
| | | H | H | Falling | C0 | C1 | PAR | C2 | C3 | C4 | C5 | C6 |
| Mode Register Set | MRR | H | H | Rising | L | L | L | OP7 | MA0 | MA1 | MA2 | MA3 |
| | | H | H | Falling | OP0 | OP1 | PAR | OP2 | OP3 | OP4 | OP5 | OP6 |
| Activate | ACT | H | H | Rising | L | H | L | H | R15 | BA0 | BA1 | BA2 |
| | | H | H | Falling | V | V | R11 | R12 | PAR | R13 | R14 | BA3 |
| | | H | H | Rising | V | V | R5 | R6 | R7 | R8 | R9 | R10 |
| | | H | H | Falling | V | V | R0 | R1 | PAR | R2 | R3 | R4 |
| Precharge | PRE | H | H | Rising | L | H | H | H | L | BA0 | BA1 | BA2 |
| | | H | H | Falling | V | V | V | V | PAR | V | L | BA3 |
| Precharge All | PREA | H | H | Rising | L | H | H | H | L | BA0 | BA1 | BA2 |
| | | H | H | Falling | V | V | V | V | PAR | V | H | BA3 |
| Refresh (per Bank) | REFA | H | H | Rising | L | H | L | L | H | BA0 | BA1 | BA2 |
| | | H | H | Falling | V | V | V | V | PAR | V | L | BA3 |
| Refresh | REFA | H | H | Rising | L | H | L | L | H | BA0 | BA1 | BA2 |
| | | H | H | Falling | V | V | V | V | PAR | V | H | BA3 |
| Pwr Dwn Entry | PDE | H | L | Rising | L | H | H | H | H | V | V | V |
| | | | | Falling | V | V | V | V | PAR | V | V | V |
| Self Refresh Entry | SRE | H | L | Rising | L | H | L | L | H | V | V | V |
| | | | | Falling | V | V | V | V | PAR | V | V | V |
| Pwr Dwn & Self Refresh | PDX/SRX | L | H | Rising | L | H | H | H | H | X | X | X |
| | | | | Falling | V | V | X | X | X | X | X | X |

FIG. 6

FLEXIBLE COMMAND ADDRESSING FOR MEMORY

CROSS-REFERENCES TO RELATED APPLICATIONS

This application is a continuation of U.S. application Ser. No. 14/926,860, filed on Oct. 29, 2015, which is further a continuation of U.S. application Ser. No. 13/536,663, filed on Jun. 28, 2012, now issued as U.S. Pat. No. 9,202,551, which are incorporated herein by reference in their entirety.

TECHNICAL FIELD

Embodiments of the invention generally relate to the field of electronic devices and, more particularly, flexible command addressing for memory.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

Within a stacked memory, there may be multiple channels, thereby allowing for separate operations in each channel of a memory device.

However, the use of stacked memory and other similar memory architecture may require a large number of bus connections to provide the required connections for each channel. Among the bus connections required are connections for both column and row commands.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 is an illustration of channel of memory;

FIG. 4 is an illustration of addressing of column commands of a memory;

FIG. 5 is an illustration of addressing of row command of a memory;

FIG. 6 is an illustration of addressing of column and row commands for an embodiment of a shared command bus;

DETAILED DESCRIPTION

Figure 1:
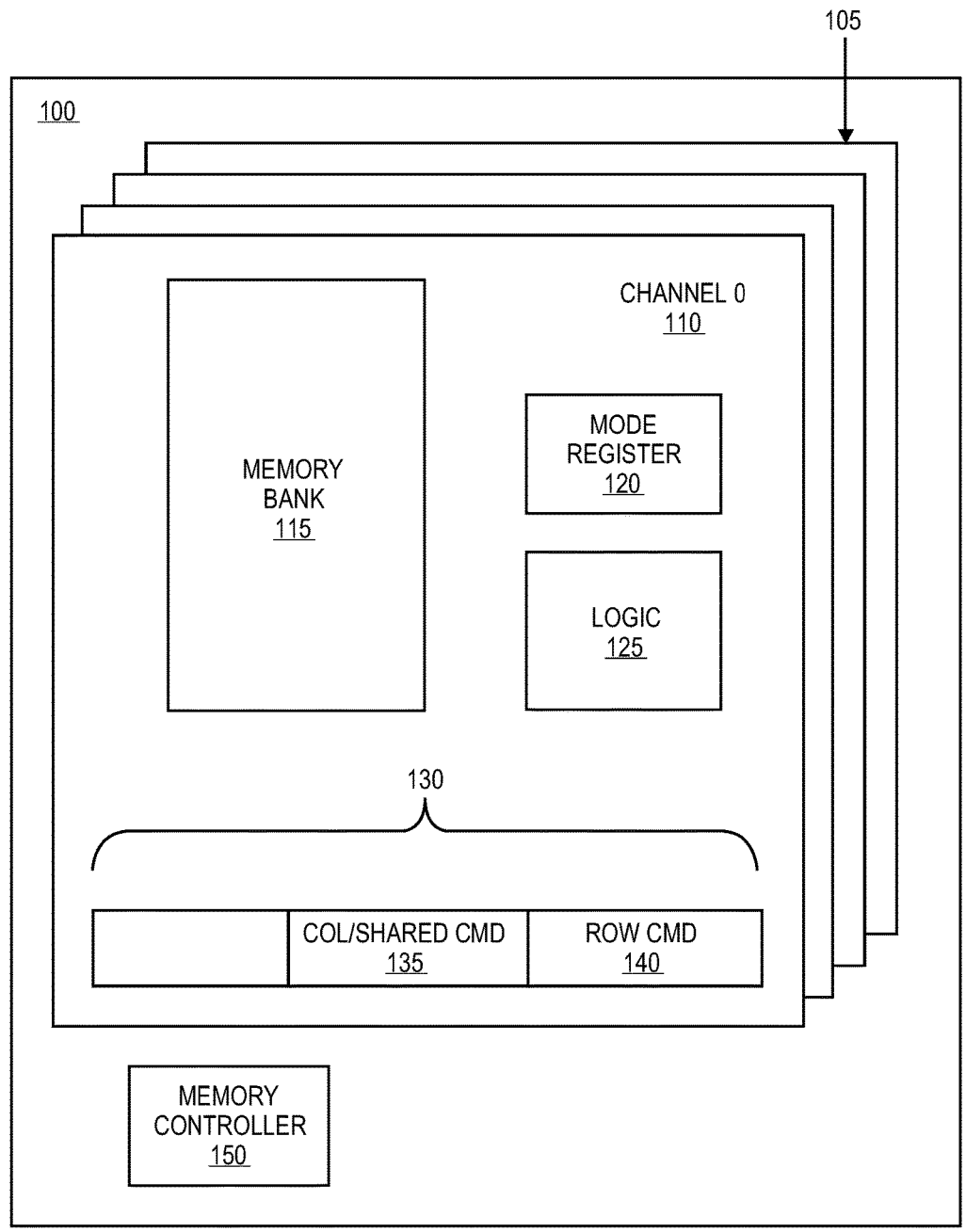
FIG. 1 illustrates an embodiment of a shared command memory architecture.

Embodiments of the invention are generally directed to flexible command addressing for memory.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics processing unit (GPU).

With the advent of the stacked DRAM standard (such as the WideIO standard), the DRAM wafer may be stacked with a system element such as a system on chip (SoC) wafer in the same package with a memory stack. The stacked memory may utilize through silicon via (TSV) manufacturing techniques, where vias are produced through silicon dies to provide signal paths through the memory stack.

A stacked memory device may include a system chip and one or more DRAM chips, the DRAM chips forming memory strata or layers coupled with the system chip. Each memory stratum may include a plurality of tiles (or portions) of memory. The stacked memory device may include multiple channels, where a channel may include a column of tiles, such as a tile in each of the strata of the memory device. In some embodiments, a memory device may be a WideIO compatible memory device.

However, a stacked memory device may utilize a large number of connections. For example, each channel of a memory device may include bus connections for the commands to be handled by the memory device, where such commands many include both row commands (or, more generally, commands of a first type) and column commands (or commands of a second type) of a memory.

In some embodiments, a method, apparatus, or system provides for flexible command addressing. In some embodiments, flexible command addressing includes shared row and column command addressing for memory. In some embodiments, a memory provides for improved command efficiency for an interface using shared addressing and the elimination of dedicated pins for addressing of certain commands.

A memory is commonly addressed by row and column, where a number of bits are utilized in a bus for row and column operations. In an example, in a high bandwidth memory (HBM) there may be 8 separate 128-bit channels with dedicated row and column address for each. In this example, switching to shared row and column bus where a row command utilizes 6 bits may result in a savings of 6 pins per channel, or 48 pins per interface.

In some embodiments, in contrast to a conventional memory utilizing row and column commands, a method, apparatus, or system provides for a flexible addressing system that allows for row commands and column commands in a single shared bus. In some embodiments, a memory operates with the elimination of row command dedicated pins while still supporting the row commands using a shared bus having common command pins.

In some embodiments, a memory includes one or more pins on a bus that designate a row command, a column command, or other command. In one example, two bits of a shared bus may be utilized to designate a row command, where a certain signal combination is not utilized for column or other commands and thus may be used to designate a row command. In an implementation, a low signal on a first pin and a high signal on a second pin detected by a DRAM results in the interpretation of an input as a row command. In some embodiments, the signal is an unused combination for column commands, and thus does not reduce the number of bits available for column commands.

In some embodiments, a no operation (NOP) row command and a NOP column command are combined into a single command for a shared bus, thereby eliminating a command. In some embodiments, a memory allows for elimination of one command by recognizing a NOP for both row commands and column commands.

In some embodiments, a memory includes a mode register bit to allow a choice between a shared bus mode and a separate bus mode. In some embodiments, the memory recognizes both row and column commands on shared bus pins in the shared bus mode, and recognizes row columns on row bus pins and column commands on column bus pins in the separate bus mode. In some embodiments, a memory defaults to the shared bus, and, upon receipt of an MRS (Mode Register Set) command, the memory may switch from the shared mode to the separate mode.

In a particular implementation, DDR4 SDRAM (double data rate type four, synchronous dynamic random-access memory) is a type of dynamic random-access memory (DRAM) with a high bandwidth interface. DDR RAM is Double Data Rate RAM. Although DDR RAM can be designed for various clock rates, with DDR-266 RAM, for example, operating with a 133 MHz clock, while using both the leading and trailing edge of the clock cycle. In this manner, the RAM has an equivalent clock rate of 266 MHz, which thus is a double data rate. In some embodiments, DDR commands are utilized in a memory, the memory providing flexible addressing such that DDR row commands and column commands are recognized on common pins of a shared command bus.

FIG. 1 illustrates an embodiment of a shared command memory architecture. In some embodiments, a memory 100 includes a plurality of channels 105 including a first channel (Channel 0) 110 and a memory controller 150. The memory 100 may be a stacked memory device, including a WideIO compatible device. In some embodiments, the first channel 110 of the memory device includes a memory bank 115 for the storage of data, a bus 130 for the transfer of data to and from the channel of the memory, a mode register 120 to establish either a shared mode or a separate row and column mode for the bus, and logic 125 to handle the switching of the mode of the bus.

In some embodiments, the mode register may default in the shared mode, with the logic switching the operation of the bus 130 to the separate row and column mode upon receiving a command for switching of such mode. In some embodiments, the bus includes a first portion for shared commands or for column commands 135 and a second portion for row commands 140. In some embodiments, in a certain device, including a stacked memory device, the logic 125 interprets row and column commands utilizing the first portion 135, thereby eliminating the need for pins to connection with the second portion 140 of the bus for the handling of row commands.

Figure 2:
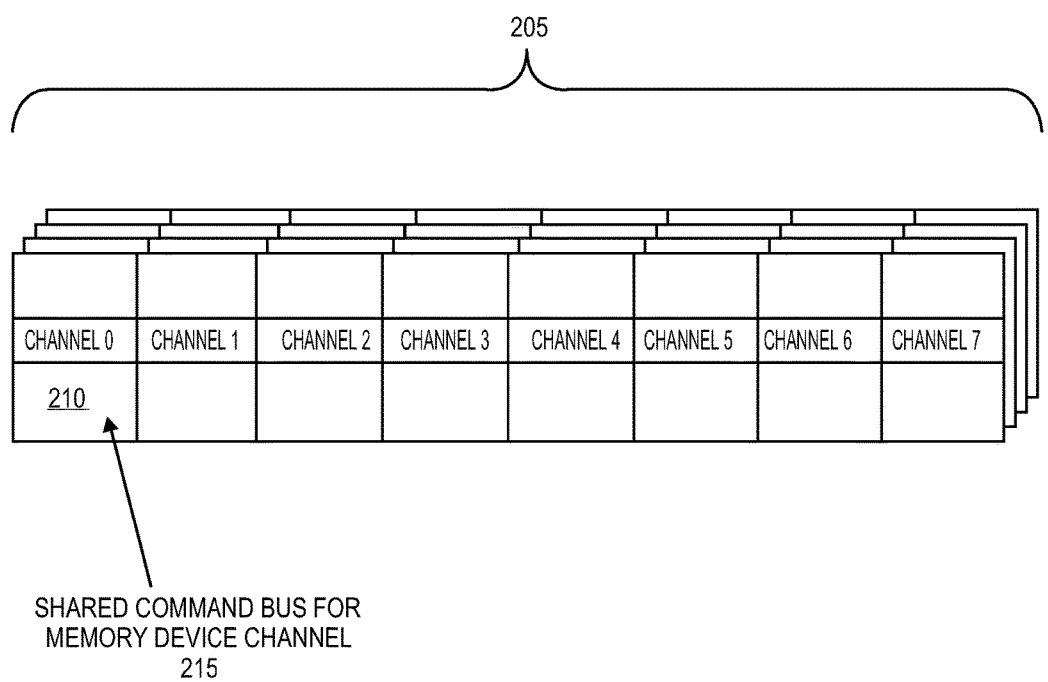
FIG. 2 is an embodiment of channels of a memory device utilizing shared command operation.

FIG. 2 is an embodiment of channels of a memory device utilizing shared command operation. In some embodiments, a memory device includes a plurality of channels 205, shown as eight channels, Channel 0 through Channel 7, in FIG. 2. In some embodiments, each channel includes a column or stack of tiles of memory strata.

In some embodiments, Channel 0 210 includes a shared memory bus 215, such as illustrated in as the second portion 135 of a bus 130 in FIG. 1, for the handling of column and row commands without requiring separate pins for receipt of a row command signal.

FIG. 3 is an illustration of the characteristics of a channel of memory. In this illustration, the channel characteristics 300 include a requirement for an increasing number of pins for larger memory, such as the illustrated memories of density 8 Gb, 16 Gb, and 32 Gb. The division of memory into multiple channels requires command addressing at each channel, thus requiring a multiple of the pins required for a single channel of memory. In some embodiments, the memory includes flexible command addressing, such utilizing as the memory architecture illustrated in FIG. 1, to allow for reduction in the number of dedicated pins required for the addressing of types of commands. In some embodiments, a shared bus allows for use of common pins to address row and column commands.

FIG. 4 is an illustration of addressing of column commands of a memory. In some embodiments, row commands 400 are encoded on six DDR CA (Command/Address) pins designated as R (Row) pins R(0) through R(5). However, the number of row commands can vary, and may generically be designated as n pins. As indicated in the notes of the chart, BA=Bank Address, PAR=Parity Signal, and V=Valid Signal (H, High, or L, Low).

The row commands include signals of a CKE pin (SDR command pin), FIG. 3 illustrating a status of the CK pin for the clock period the command is sampled (CK_t(n)) and one clock period earlier (CK_t(n−1)), where row commands include CKE H and H, with the exception of Power Down Entry (PDE) and of Self Refresh Entry (SRE), indicated by H and L, and Power Down & Self Refresh (PDX/SRX), indicated by L and H. As indicated, the row commands includes a row no operation (RNOP) command.

In some embodiments, a memory includes a shared bus, allowing for the elimination of dedicated pins R(0) through R(5) for addressing of row commands.

FIG. 5 is an illustration of addressing of column commands of a memory. In some embodiments, column commands 500 are encoded on eight DDR CA pins designated as C (Column) pins C0 through C7. However the number of column pins may vary, and may generically be referred to here as (n+m) pins, indicating a number of pins that is greater by m than the number of pins n required for row command addressing, as illustrated in FIG. 4. The column commands include the CKE pin being at values H and H for the clock period the command is sampled (CK_t(n)) and one clock period earlier (CK_t(n−1)). As indicated, the column commands includes a column NOP (CNOP) command.

It is noted that column commands generally commence with C(0,1)=(H, L), with the column NOP commencing with (H, H) and Mode Register Set (MRS) commencing with (L, L). C(0,1) does not equal (L, H) for any of the column command addresses.

Thus, the column and row commands illustrated in FIGS. 4 and 5 require a total of fourteen pins for the command addressing, six (n) for the row command addressing and eight (n+m) for column command addressing. In some embodiments, the pins allocated for column addressing are utilized for a shared bus, the shared bus providing for the handling of the row commands illustrated in FIG. 4 and the column commands illustrated in FIG. 5, with the row command pins R(0) to R(5) being eliminated. In some embodiments, such pins are eliminated for each of a plurality of channels of a memory device, thus allowing for a significant reduction in required pins for a memory device.

FIG. 6 is an illustration of addressing of column and row commands for an embodiment of a shared command bus. In some embodiments, the commands of FIGS. 4 and 5 are supported by a shared command bus, where the commands 600 are addressed with eight CA pins designated as RC (Row Column) pins RC(0) through RC(7).

In some embodiments, the number of pins is eight, or (n+m), allowing an additional m (where m=2 in this case) pins above the n (where n=6 in this case) used for row command addressing to allow for the designation of the row commands (or, in general to separate the first set of commands from the second set of commands). In some embodiments, row commands may utilize the two additional bits on the RC0 and RC1 pins (in comparison to the row command pins), where RC (0,1)=(L, H) for a command, thereby designating the row commands with an initial signal combination that was not utilized for column commands.

In some embodiments, the shared commands include a common no operation (Common NOP) substituting for the CNOP and RNOP commands, thereby eliminating the need for a separate NOP command for row commands. In some embodiments, the shared bus allows for the elimination of the row CA pins designated as R(0) to R(5) in FIG. 4.

Figure 7:
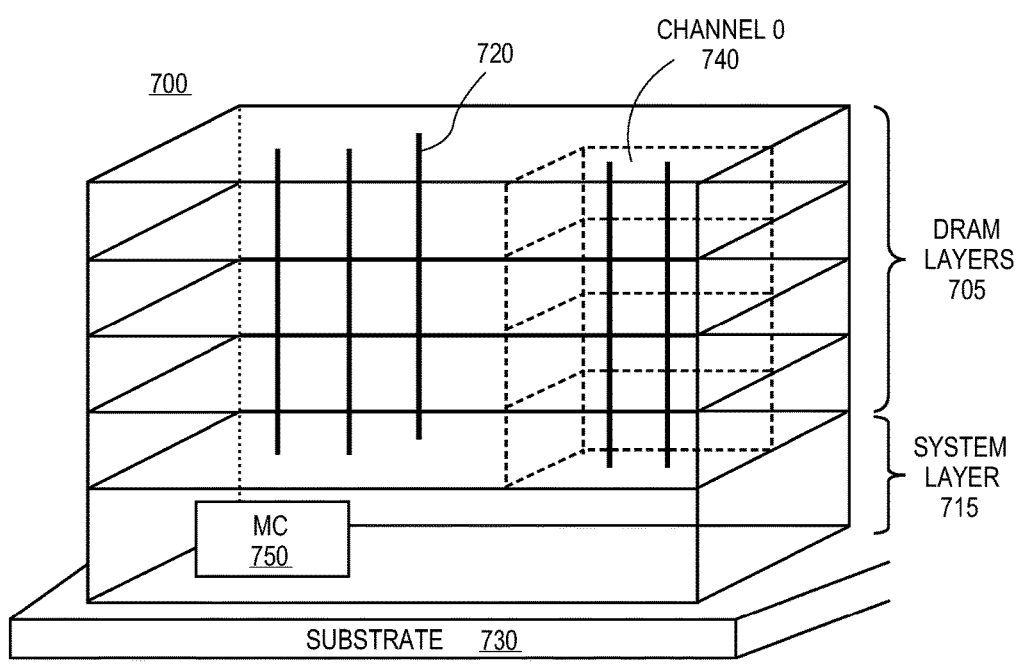
FIG. 7 illustrates an embodiment of a memory device including a shared bus for a channel.

FIG. 7 illustrates an embodiment of a memory device including a shared bus for a channel. In this illustration, a 3D stacked memory device 700, such as a WideIO memory device, includes a system layer or other element 715 on a substrate 730 coupled with one or more DRAM memory die layers 705, also referred to herein as the memory stack. In some embodiments, the system element 715 may be a system on chip (SoC) or other similar element. In this illustration, the DRAM memory die layers include four memory die layers. However, embodiments are not limited to any particular number of memory die layers in the memory stack 705, and may include a greater or smaller number of memory die layers. Each die layer may include one or more slices or portions, and have one or more different channels, including a channel 0 740. Each die layer may include a temperature compensated self-refresh (TCSR) circuit to address thermal issues, where the TCSR and a mode register may be a part of management logic of the device.

Among other elements, the system element 715 may include a memory controller 750, such as a WideIO memory controller, for the memory stack 705. In some embodiments, each memory die layer, with the possible exception of the top (or outermost) memory die layer of the memory stack, includes a plurality of through silicon vias (TSVs) 720 to provide paths through the memory die layers. While a small number or TSVs are provided in FIG. 7 for ease of illustration, an actual number of TSVs may be much greater.

In some embodiments, each channel of the memory, such as the illustrated channel 0, includes a shared bus for handling of both column and row commands, thereby allowing for a reduction in the number of pins required for addressing of commands for channels of the memory. In some embodiments, the channel may include the elements of the shared command memory architecture illustrated in FIG. 1.

Figure 8:
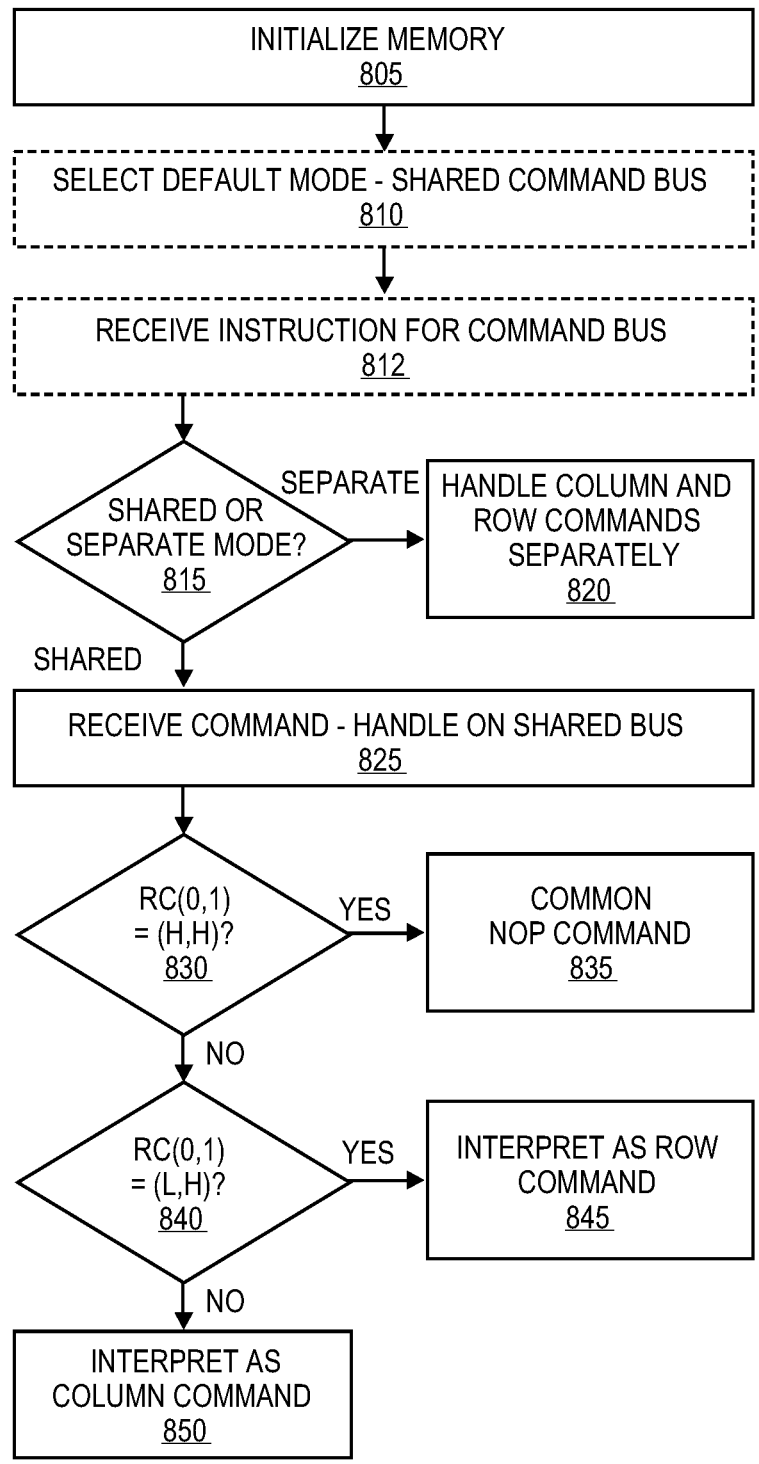
FIG. 8 is a flow chart to illustrate an embodiment of shared command operation of a memory.

FIG. 8 is a flow chart to illustrate an embodiment of shared command operation of a memory. In some embodiments, a memory, such as a channel of a memory device, may be initialized or other accessed 805. In some embodiments, the memory may select a default mode, where the mode may be a shared command bus mode 810. In some embodiments, the memory may receive a command regarding the bus mode 812, where the command may be an MRS (Mode Register Set) command to set the bus mode.

In some embodiments, if the mode is a separate bus mode 815, then types of commands are handled separately 820, such as row commands being received on row address pins and interpreted as indicated in FIG. 4 and column commands being received on column address pins and interpreted as indicated in FIG. 5.

In some embodiments, if the mode is a shared bus mode 815, then, upon receiving a command of any type, the command is handled on a shared bus 825, such as row command and column commands being received on row column address pins and interpreted as indicated in FIG. 6. In a particular implementation, a command wherein RC(0, 1)=(H,H) 830 may be interpreted as a common NOP command 835, where the common NOP command replaces a row NOP command and a column NOP command; a command wherein RC(0,1)=(L,H) 840 may be interpreted as a row command 845; and a command may otherwise be interpreted as a column command 850.

Figure 9:
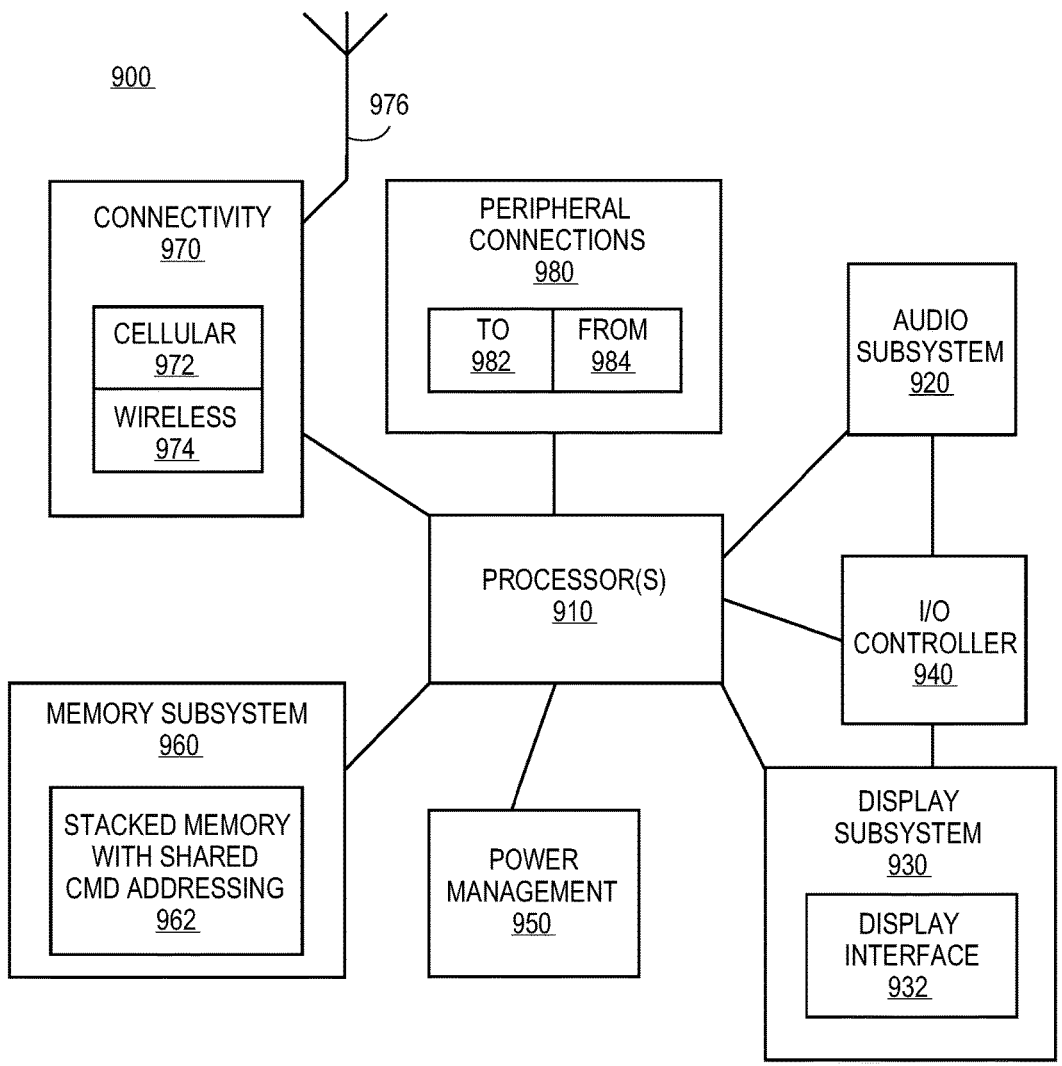
FIG. 9 is an illustration of an embodiment of an apparatus or system including stacked memory having elements for shared command operation.

FIG. 9 is an illustration of an embodiment of an apparatus or system including stacked memory having elements for shared command operation. Computing device 900 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 900. The components may be connected by one or more buses or other connections.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications, device functions, or both are executed. The processing operations include operations related to I/O (input/output) with a human user or with other devices, operations related to power management, operations, or both related to connecting device 900 to another device. The processing operations may also include operations related to audio I/O, display I/O, or both.

In one embodiment, device 900 includes audio subsystem 920, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 900, or connected to device 900. In one embodiment, a user interacts with device 900 by providing audio commands that are received and processed by processor 910.

Display subsystem 930 represents hardware (such as display devices) and software (such as drivers) components that provide a display having visual, tactile, or both elements for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In one embodiment, display subsystem 930 includes a touch screen device that provides both output and input to a user.

I/O controller 940 represents hardware devices and software components related to interaction with a user. I/O controller 940 can operate to manage hardware that is part of audio subsystem 920, a display subsystem 930, or both such subsystems. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 may interact with audio subsystem 920, display subsystem 930, or both such subsystems. For example, input through a microphone or other audio device can provide input or commands for one or more applications or functions of device 900. Additionally, audio output can be provided instead of or in addition to display output. In another example, if display subsystem includes a touch screen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, or other hardware that can be included in device 900. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation.

In some embodiments, memory subsystem 960 includes memory devices for storing information in device 900. The processor 910 may read and write data to elements of the memory subsystem 960. Memory can include nonvolatile (having a state that does not change if power to the memory device is interrupted), volatile (having a state that is indeterminate if power to the memory device is interrupted) memory devices, or both such memories. Memory 960 can store application data, user data, music, photos, documents, or other data, as well as system data (whether long-term or temporary) related to the execution of the applications and functions of system 900.

In some embodiments, the memory subsystem 960 may include a stacked memory device 962, where the stacked memory device includes shared command addressing, including, for example, the memory architecture illustrated in FIG. 1.

Connectivity 970 includes hardware devices (e.g., connectors and communication hardware for wireless communication, wired communication, or both) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 974 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 976.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (such as downloading, uploading, changing, or synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 10:
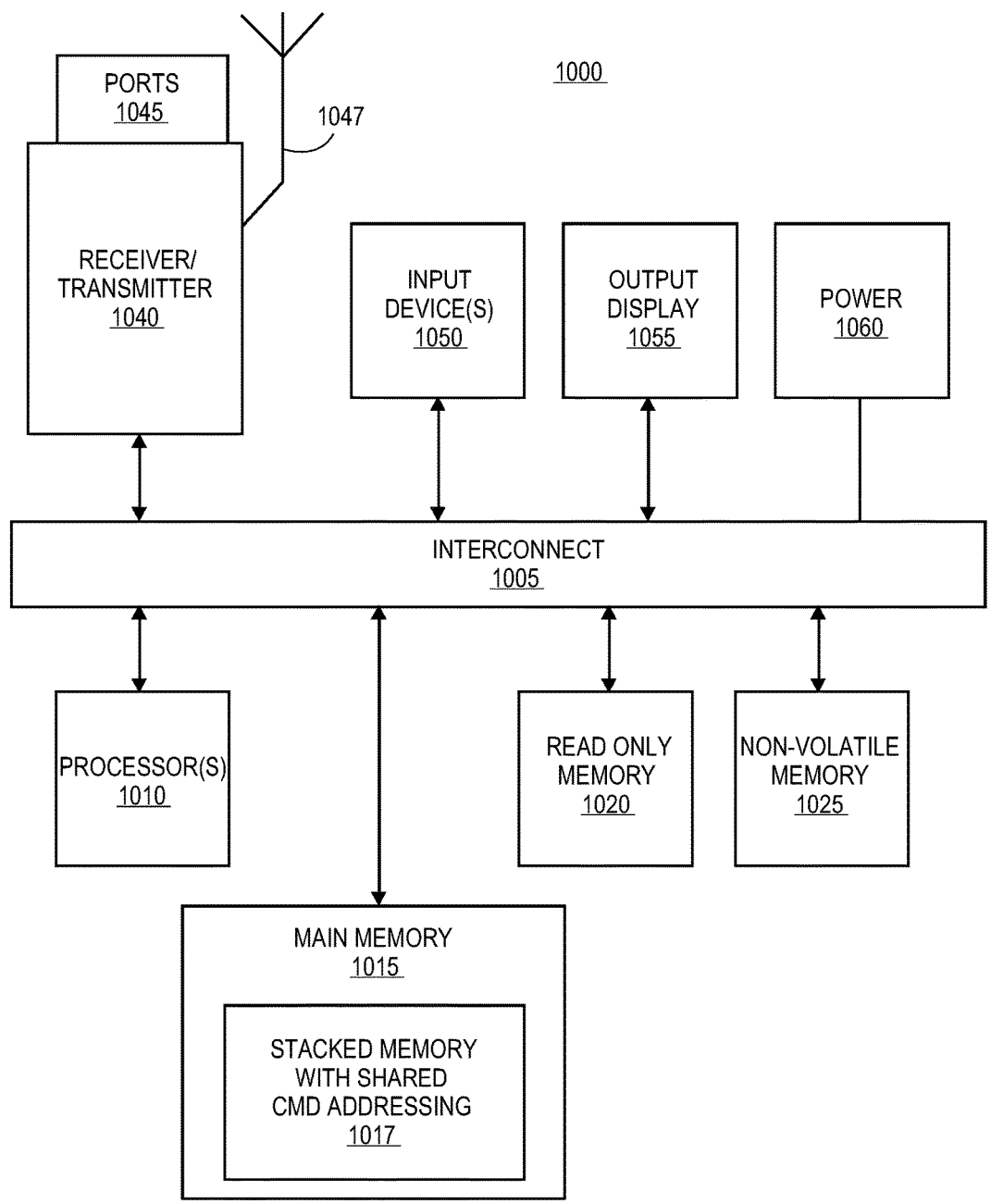
FIG. 10 an embodiment of a computing system including stacked memory having elements for shared command operation.

FIG. 10 an embodiment of a computing system including stacked memory having elements for shared command operation. The computing system may include a computer, server, game console, or other computing apparatus. In this illustration, certain standard and well-known components that are not germane to the present description are not shown. Under some embodiments, the computing system 1000 comprises an interconnect or crossbar 1005 or other communication means for transmission of data. The computing system 1000 may include a processing means such as one or more processors 1010 coupled with the interconnect 1005 for processing information. The processors 1010 may comprise one or more physical processors and one or more logical processors. The interconnect 1005 is illustrated as a single interconnect for simplicity, but may represent multiple different interconnects or buses and the component connections to such interconnects may vary. The interconnect 1005 shown in FIG. 10 is an abstraction that represents any one or more separate physical buses, point-to-point connections, or both connected by appropriate bridges, adapters, or controllers.

In some embodiments, the computing system 1000 further comprises a random access memory (RAM) or other dynamic storage device or element as a main memory 1015 for storing information and instructions to be executed by the processors 1010. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 1015 includes stacked memory 1017, wherein the stacked memory device includes shared command addressing, including, for example, the memory architecture illustrated in FIG. 1.

The computing system 1000 also may comprise a read only memory (ROM) 1020 or other static storage device for storing static information and instructions for the processors 1010. The computing system 1000 may include one or more non-volatile memory elements 1025 for the storage of certain elements.

One or more transmitters or receivers 1040 may also be coupled to the interconnect 1005. In some embodiments, the computing system 1000 may include one or more ports 1045 for the reception or transmission of data. The computing system 1000 may further include one or more omnidirectional or directional antennas 1047 for the reception of data via radio signals.

In some embodiments, the computing system 1000 includes one or more input devices 1050, where the input devices include one or more of a keyboard, mouse, touch pad, voice command recognition, gesture recognition, or other device for providing an input to a computing system.

The computing system 1000 may also be coupled via the interconnect 1005 to an output display 1055. In some embodiments, the display 1055 may include a liquid crystal display (LCD) or any other display technology, for displaying information or content to a user. In some embodiments, the display 1055 may include a touch-screen that is also utilized as at least a part of an input device. In some environments, the display 1055 may be or may include an audio device, such as a speaker for providing audio information.

The computing system 1000 may also comprise a power device or system 1060, which may comprise a power supply, a battery, a solar cell, a fuel cell, or other system or device for providing or generating power. The power provided by the power device or system 1060 may be distributed as required to elements of the computing system 1000.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, a memory device includes a DRAM, and a system element coupled with the DRAM, the system element including a memory controller for control of the DRAM. The DRAM includes a memory bank, a bus, the bus including a plurality of pins for the receipt of commands, and a logic, wherein the logic provides for shared operation of the bus for a first type of command and a second type of command received on a first set of pins. In some embodiments, the first type of command is a column command and the second type of command is a row command.

In some embodiments, the logic is further to switch between a first mode providing for the shared operation of the bus and a second mode providing for separate bus operation for receipt of the first type of command on the first set of pins as dedicated pins and the second type of command on a second set of pins. In some embodiments, the first mode does not require inclusion of the second set of pins.

In some embodiments, a memory device further includes a mode register for designation of the first mode or the second mode, the logic to switch to the first mode or the second mode based on a status of the mode register.

In some embodiments, the DRAM is a first channel of a plurality of channels of the memory device.

In some embodiments, a method includes initializing a DRAM; receiving a command for the DRAM, a command bus for the DRAM providing for shared operation for a first type of command and a second type of command, the bus having a first set of pins for the receipt of commands; interpreting the command, wherein interpreting the command includes, upon determining that a set of bits of the command are in a first state, interpreting the command as the first type of command, and, upon determining that the set of bits of the command are in a second state, interpreting the command as the second type of command. In some embodiments, the first type of command is a column command and the second type of command is a row command.

In some embodiments, interpreting the command further includes, upon determining that the set of bits of the command are in a third state, interpreting the command as a no operation (NOP) for both the first type of command and the second type of command.

In some embodiments, a method further includes switching between a first mode providing for the shared operation of the bus and a second mode providing for separate bus operation for receipt of the first type command on the first set of pins as dedicated pins and the second type of command on a second set of pins. In some embodiments, switching between the first mode and the second mode includes switching to the first mode or the second mode based on a status of a mode register. In some embodiments, switching between the first mode and the second mode includes setting the mode register based on a received mode register set (MRS) command. In some embodiments, a method further includes defaulting to the first mode for the DRAM.

In some embodiments, a system includes a processor to process data for the system; a transmitter, receiver, or both coupled with an omnidirectional antenna to transmit data, receive data, or both; and a memory device for the storage of data. The memory device includes a dynamic random-access memory (DRAM); and a system element coupled with the DRAM, the system element including a memory controller for control of the DRAM. The DRAM includes a memory bank, a bus, the bus including a plurality of pins for the receipt of commands, and a logic, wherein the logic provides for shared operation of the bus for column commands and row commands received on a first set of pins.

In some embodiments, the logic is further to switch between a first mode providing for the shared operation of the bus and a second mode providing for separate bus operation for receipt of one of either column or row commands on the first set of pins as dedicated pins and the other of column or row commands on a second set of pins. In some embodiments, the first mode does not require inclusion of the second set of pins. In some embodiments, the memory device further includes a mode register for designation of the first mode or the second mode, the logic to switch to the first mode or the second mode based on a status of the mode register.

In some embodiments, a non-transitory computer-readable storage medium having stored thereon data representing sequences of instructions that, when executed by a processor, cause the processor to perform operations including initializing a DRAM; receiving a command for a command bus for the DRAM, the command bus providing for shared operation for column commands and row commands, the bus having a first set of pins for the receipt of commands; interpreting the command, wherein interpreting the command includes, upon determining that a set of bits of the command are in a first state, interpreting the command as a row command, and, upon determining that the set of bits of the command are in a second state, interpreting the command as a column command.

In some embodiments, interpreting the command further includes, upon determining that the set of bits of the command are in a third state, interpreting the command as a NOP for both column commands and row commands.

In some embodiments, the medium further includes instructions for switching between a first mode providing for the shared operation of the bus and a second mode providing for separate bus operation for receipt of one of either column or row commands on the first set of pins as dedicated pins and the other of column or row commands on a second set of pins. In some embodiments, switching between the first mode and the second mode includes switching to the first mode or the second mode based on a status of a mode register.

In some embodiments, medium further includes instructions for defaulting to the first mode for the DRAM.

What is claimed is:

1. A dynamic random access memory (DRAM) chip comprising:
   a memory bank to store data; and
   hardware logic to receive commands via command/address (CA) pins to access the memory bank, the hardware logic to:
   receive a first command, including receipt of a row address via a plurality of the CA pins, and determine the first command comprises an ACTIVATE command based at least in part on detection of a logic LOW on a first CA pin and a logic HIGH on a second CA pin;
   receive a second command, including receipt of a column address via one or more of the plurality of CA pins, and determine the second command comprises a READ or WRITE command based at least in part on detection of a logic HIGH on the first CA pin and a logic LOW on the second CA pin; and receive a third command, and determine the third command comprises a No-operation (NOP) command based at least in part on detection of a logic HIGH on the first CA pin and a logic HIGH on the second CA pin;
wherein the hardware logic is to receive the following over a same CA pin: a column address bit for the READ or WRITE command, a row address bit for the ACTIVATE command, and a command encoding bit for the ACTIVATE, READ or WRITE, and NOP commands.

2. The DRAM chip of claim 1, wherein:
the first CA pin comprises a lowest of a sequential ordering of CA pins and the second CA pin comprises a second lowest of the sequential ordering of CA pins.

3. The DRAM chip of claim 2, wherein:
the first CA pin comprises CA[0] and the second CA pin comprises CA[1].

4. The DRAM chip of claim 1, wherein:
the CA pin is CA[1].

5. The DRAM chip of claim 1, wherein:
the CA pins comprise a CA bus for one of multiple channels.

6. The DRAM chip of claim 1, wherein:
the DRAM chip comprises a Wide Input/Output (IO) compatible device.

7. A system comprising:
a stack of DRAM memory chips;
a memory controller coupled with the stack of DRAM memory chips to control the DRAM memory chips, wherein a DRAM memory chip comprises:
a memory bank to store data; and
hardware logic to receive commands via command/address (CA) pins to access the memory bank, the hardware logic to:
receive a first command, including receipt of a row address via a plurality of the CA pins, and determine the first command comprises an ACTIVATE command based at least in part on detection of a logic LOW on a first CA pin and a logic HIGH on a second CA pin;
receive a second command, including receipt of a column address via one or more of the plurality of CA pins, and determine the second command comprises a READ or WRITE command based at least in part on detection of a logic HIGH on the first CA pin and a logic LOW on the second CA pin; and
receive a third command, and determine the third command comprises a No-operation (NOP) command based at least in part on detection of a logic HIGH on the first CA pin and a logic HIGH on the second CA pin;
wherein the hardware logic is to receive the following over a same CA pin: a column address bit for the READ or WRITE command, a row address bit for the ACTIVATE command, and a command encoding bit for the ACTIVATE, READ or WRITE, and NOP commands.

8. The system of claim 7, wherein:
the first CA pin comprises a lowest of a sequential ordering of CA pins and the second CA pin comprises a second lowest of the sequential ordering of CA pins.

9. The system of claim 8, wherein:
the first CA pin comprises CA[0] and the second CA pin comprises CA[1].

10. The system of claim 7, wherein:
the CA pin is CA[1].

11. The system of claim 7, wherein:
the CA pins comprise a CA bus for one of multiple channels.

12. The system of claim 7, wherein:
a DRAM chip comprises a Wide Input/Output (10) compatible device.

13. The system of claim 7, further comprising:
a processor.

14. The system of claim 13, wherein:
the processor comprises the memory controller.

15. The system of claim 13, wherein:
the processor comprises one or more of a central processing unit (CPU) or a graphics processing unit (GPU).

16. The system of claim 13, further comprising:
a system on a chip (SoC), the SoC including the processor.

17. The system of claim 13, wherein:
the processor and the stack of DRAM chips are in a same package.

18. The system of claim 7, further comprising:
a through silicon via (TSV) through the stack of DRAM chips to couple the DRAM chips with the memory controller.

19. The system of claim 7, further comprising one or more of: a display, an antenna, a battery.

20. A method comprising:
receiving a first command via command/address (CA) pins of a DRAM chip, including receiving a row address via a plurality of the CA pins;
determining the first command comprises an ACTIVATE command based at least in part on detecting a logic LOW on a first CA pin and a logic HIGH on a second CA pin;
receiving a second command, including receiving a column address via one or more of the plurality of CA pins;
determining the second command comprises a READ or WRITE command based at least in part on detecting a logic HIGH on the first CA pin and a logic LOW on the second CA pin;
receiving a third command; and
determining the third command comprises a No-operation (NOP) command based at least in part on detecting a logic HIGH on the first CA pin and a logic HIGH on the second CA pin;
wherein receiving the first, second, and third commands includes receiving the following over a same CA pin: a column address bit for the READ or WRITE command, a row address bit for the ACTIVATE command, and a command encoding bit for the ACTIVATE, READ or WRITE, and NOP commands.

* * * * *